United States Patent [19]

Injeyan et al.

[11] Patent Number: 5,488,619
[45] Date of Patent: Jan. 30, 1996

[54] ULTRACOMPACT Q-SWITCHED MICROLASERS AND RELATED METHOD

[75] Inventors: Hagop Injeyan, Glendale; Terry L. Holcomb, Torrance, both of Calif.

[73] Assignee: TRW Inc., Redondo Beach, Calif.

[21] Appl. No.: 319,192

[22] Filed: Oct. 6, 1994

[51] Int. Cl.⁶ .................................................. H01S 3/115
[52] U.S. Cl. ............................ 372/12; 372/11; 372/17
[58] Field of Search ................................. 372/11, 12, 17

[56] References Cited

U.S. PATENT DOCUMENTS

| | | | |
|---|---|---|---|
| Re. 34,192 | 3/1993 | Baer | 372/10 |
| 3,611,231 | 10/1971 | Burke | 331/94.5 |
| 3,699,474 | 10/1972 | Landry | 372/17 |
| 3,902,061 | 8/1975 | Harris | 250/213 A |
| 4,439,861 | 3/1984 | Bradford | 372/25 |
| 4,727,341 | 2/1988 | Nishi et al. | 332/7.51 |
| 4,764,933 | 8/1988 | Kozlovsky et al. | 372/40 |
| 4,819,239 | 4/1989 | Sharp et al. | 372/12 |
| 4,860,304 | 8/1989 | Mooradian | 372/92 |
| 4,953,166 | 8/1990 | Mooradian | 372/21 |
| 4,982,405 | 1/1991 | Zayhowski et al. | 372/10 |
| 5,014,277 | 5/1991 | Van Driel et al. | 372/18 |
| 5,105,302 | 4/1992 | Nagao et al. | 359/245 |
| 5,105,434 | 4/1992 | Krupke et al. | 372/69 |
| 5,115,445 | 5/1992 | Mooradian | 372/75 |
| 5,125,000 | 6/1992 | Labrunie et al. | 372/75 |
| 5,132,977 | 7/1992 | Kojima et al. | 378/85 |
| 5,140,604 | 8/1992 | Alablanche et al. | 372/41 |
| 5,151,915 | 9/1992 | Paoli | 372/50 |
| 5,166,946 | 11/1992 | Caldwell | 372/50 |
| 5,175,739 | 12/1992 | Takeuchi et al. | 372/45 |
| 5,208,823 | 5/1993 | Patel | 372/50 |
| 5,226,051 | 7/1993 | Chan et al. | 372/30 |
| 5,237,578 | 8/1993 | Amano | 372/22 |

OTHER PUBLICATIONS

Pezeshki et al., *Large Reflectivity Modulation Using InGaAs–GaAs* IEEE Photronics Tech. Letters, vol. 2, No. 11 (Nov. 1990) pp. 807–808.

Kotaka et al., *High–Speed InGaAlAs/InAlAs Multiple Quantum Well Optical Modulators* . . . IEEE Photronics Tech. Letters, vol. 1, No. 5 (May, 1989) pp. 100–101.

*Primary Examiner*—Brian Healy
*Assistant Examiner*—Robert E. Wise

[57] ABSTRACT

An ultracompact array of microlasers in which Q-switching is performed by intracavity electroabsorptive modulators, to provide an array of relatively high-power beams with good beam quality and other beam characteristics. The microlasers are optically pumped by light beams from an array of semiconductor diode lasers, each of which is individually controlled by a separate electrode. Light from the diode lasers is coupled directly into a slab of solid-state crystal material, such as Nd:YVO₄ (neodymium:yttrium vanadate), in which laser action takes place. The solid state material in part defines an array of laser cavities and an array of individually controllable Q-switching elements is integrated into the cavities, permitting Q-switching of each of the array elements. The Q-switching elements are electroabsorptive modulators that permit extremely rapid switching of the microlaser elements and provide output pulses of relatively high peak powers.

10 Claims, 1 Drawing Sheet

ULTRACOMPACT Q-SWITCHED MICROLASERS AND RELATED METHOD

BACKGROUND OF THE INVENTION

This invention relates generally to arrays of extremely small solid-state lasers and, more particularly, to techniques for producing higher peak powers in arrays of solid-state lasers. There are a number of useful applications for arrays of lasers of moderate to high peak powers, such as in printing applications.

A conventional technique, referred to as Q switching, is often used to obtain higher peak powers from lasers. As is well known, light in a laser cavity makes repeated reflections from opposed mirrors that define one dimension of the cavity. The Q factor, or quality factor, of a laser cavity can be considered to be a measure of the number of round trips taken by light in the cavity before being outcoupled as emitted light. A Q switch is simply a device for varying the Q of a cavity, usually by selecting a high or a low value. A zero Q value means that lasing is suppressed almost completely, while a high Q means that lasing is taking place in the cavity. A simple form of Q switch is a mechanical shutter disposed in the laser cavity. If the shutter is closed, the Q of the cavity is zero. Laser action cannot then occur but energy is effectively stored in the cavity for some types of lasers. If the shutter is then suddenly opened, switching to a higher Q, the stored energy will be released in the form a short and intense light pulse. Other types of Q switches use electro-optical shutters, or piezoelectric transducers to move the cavity mirrors.

Although Q switching is a well known technique, most Q switches tend to be extremely bulky and to have a relatively long switching time. Consequently, Q switches are harder to develop for extremely small lasers, or microlasers, and it is difficult to scale traditional Q switch designs down to the sizes needed in microlaser arrays. Moreover, as the laser cavities under consideration get smaller and smaller, energy builds up faster than for larger cavities and the Q switch must be correspondingly faster in operation.

Electro-absorptive switches have been used as light modulators external to laser cavities. In U.S. Pat. No. 5,151,915 to Paoli, an electro-absorptive element is disclosed for use in a semiconductor diode array. Application of appropriate bias voltages to the electro-absorptive elements is used to selectively switch the diodes in the array on or off, but no energy is stored in the cavities of those in the off condition because semiconductor diode lasers are incapable of storing energy when not lasing.

It will be appreciated from the foregoing that there is a need for a highly compact laser array structure having laser elements that are individually addressable to produce moderate to high peak output powers. The present invention meets this need, as will become apparent from the following summary.

SUMMARY OF THE INVENTION

The present invention resides in an ultracompact array of microlasers that can be individually Q-switched to provide high peak output powers and high laser beam quality. Briefly, and in general terms, the device of the invention is an array of Q-switched microlasers, comprising an array of individually addressable diode lasers adapted to produce an array of generally parallel output light beams; an array of microlenses positioned in the array of generally parallel output light beams to provide collimation of the output beams; and a crystal functioning as a laser gain medium, positioned to receive the generally parallel output light beams from the diode lasers, such that the light beams provide optical pumping of the laser gain material of the crystal. The device of the invention further includes an array of individually addressable electroabsorptive modulators formed in resonant cavities that are defined in part by the laser gain medium; and means for selectively electrically biasing the electroabsorptive modulators periodically to provide a Q-switching function in which relatively higher power output peaks are obtained from selected elements of the microlaser laser array.

In the illustrative embodiment of the invention, the array of individually addressable diode lasers is formed in a composite semiconductor layer that includes an active layer and a pair of integral reflective surfaces for each member of the array, to produce an emitted light beam for each member of the array generally perpendicular to the composite semiconductor layer.

More specifically, the array of electroabsorptive modulators includes a single semiconductor quantum well stack and multiple biasing electrodes positioned at positions adjacent to respective light beams output from the laser gain medium, to provide individually addressable Q-switching of the light beams emitted from the microlaser array. The crystal providing the gain medium and the array of electroabsorptive modulators incorporate reflective surfaces that define a laser cavity encompassing both the laser gain medium and the electroabsorptive modulators. That is, the electroabsorptive modulator elements are installed inside the respective solid-state laser cavities.

The array of Q-switched microlasers may also include a frequency doubling crystal formed adjacent to the electroabsorptive modulators, and an optical parametric oscillator for conversion of light emitted from the array to longer wavelengths.

The present invention may also be defined in terms of a novel method for generating an array of laser beams of relatively high power and beam quality. The method comprises the steps of generating an array of generally parallel light beams from an array of semiconductor diode lasers; collimating the generally parallel light beams in the array; optically pumping an array of solid-state lasers by introducing the array of generally parallel light beams into a laser crystal gain medium that in part defines a laser cavity for each of an array of solid state lasers; emitting an array of amplified laser light beams from the gain medium; and selectively Q-switching the solid-state lasers to provide pulsed output beams of relatively high peak powers. The Q-switching function is performed by controlling an electroabsorptive modulator element associated with each of the output beams.

More specifically, the step of selectively Q-switching the solid-state lasers includes selectively biasing the electroabsorptive modulator elements to effect switching between a transparent state in which lasing is permitted to take place and an absorptive state in which lasing is suppressed. The method may also include the steps of doubling the output frequency of light beams emitted in the emitting step, using a frequency multiplier crystal, and converting the light beams emitted in the emitting step to longer wavelengths, using an optical parametric oscillator.

DESCRIPTION OF THE PREFERRED EMBODIMENT

Figure 1:
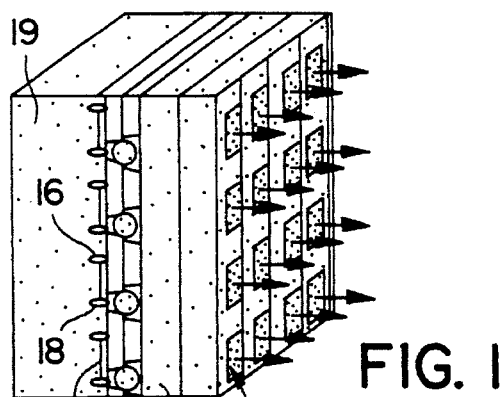
FIG. 1 is a simplified three-dimensional view of a two-dimensional Q-switched microlaser array in accordance with the invention.

As shown in the drawings for purposes of illustration, the present invention pertains to arrays of very small lasers, called microlasers, which can be used in a variety of applications involving imaging or printing. Arrays of semiconductor diode lasers have been proposed for applications of the same general type but these devices inherently operate in continuous-wave (CW) mode and do not have the beam quality and other characteristics that would be preferable for microlaser array applications.

Figure 2:
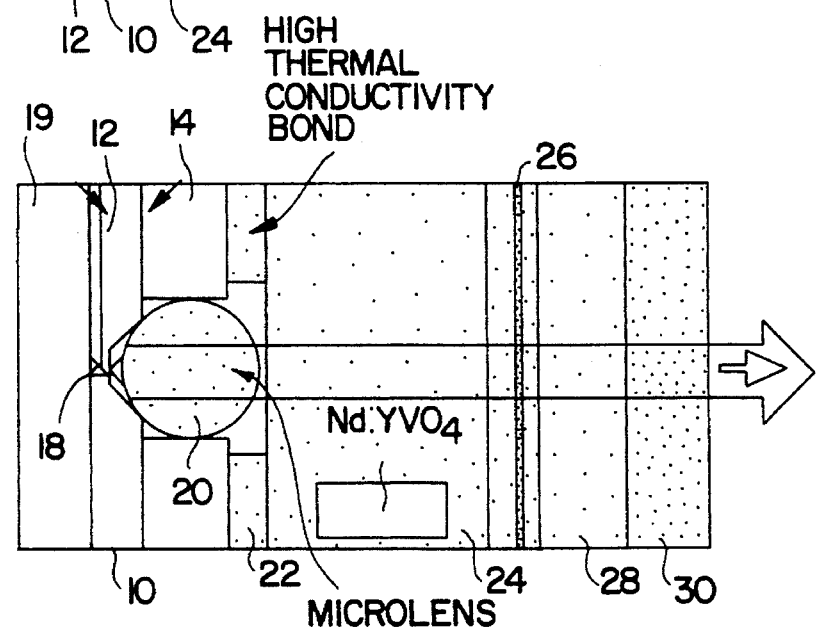
FIG. 2 is an enlarged cross-sectional view of one of the microlaser elements of the array of FIG. 1.
Figure 3:
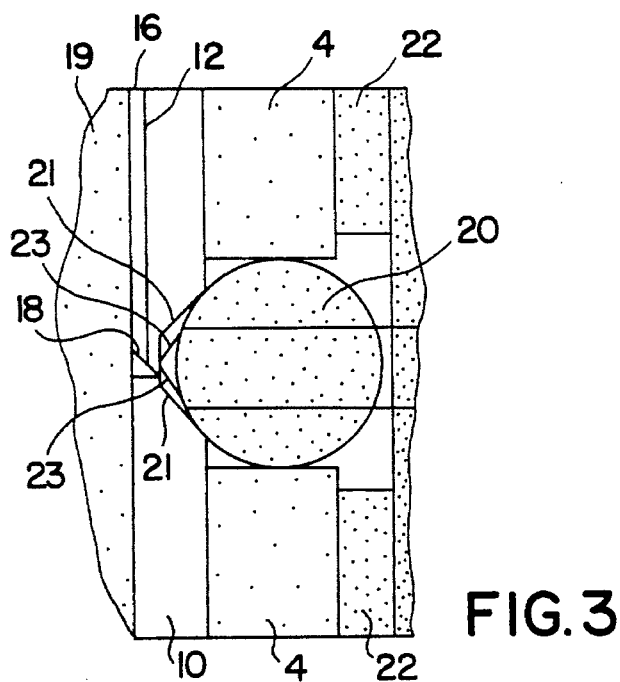
FIG. 3 is a further enlarged, fragmentary cross-sectional view of the microlaser element shown in FIG. 2.

In accordance with the invention, an array of diode lasers is used to provide optical pumping of an ionic solid-state microlaser array using a solid-state crystal as the laser gain medium, and each elemental microlaser is Q-switched by means of an electroabsorptive modulator formed integrally with the laser gain medium. FIGS. 1 and 2 show a gallium arsenide (GaAs) chip 10 on which is formed an array of diode lasers. As best shown in FIG. 2, the GaAs chip 10 has formed in it an active layer 12 in which lasing action takes place in accordance with well known principles of diode lasers. Each diode laser in the array has its own electrode 14 on one side of the chip 10 and there is a common electrode (not shown) positioned on the other side of the chip. Applying a suitable bias voltage to the electrodes causes lasing in the active layer 12 if there are suitable mirrors formed at the ends of the active layer. In the illustrative embodiment of the invention, each elemental portion of the active layer 12 has one end mirror formed by a slot 16 perpendicular to the layer. Another opening in the GaAs chip 10 forms a reflecting surface 18 at 45° to the active layer 12, so that light is emitted from diode laser perpendicular to the plane of the active layer 12. Preferably, the GaAs chip 10 is positioned adjacent to a cooling device or heat sink 19 to provide appropriate cooling for the diode lasers.

At each light emitting elemental surface area of the diode laser array, a V-shaped recess 21 is formed in the GaAs chip, to accommodate a microlens 20 for collimation of the emitted light 23. The microlens 20 is positioned partly in the recess 21 and partly between adjacent electrodes 14 of the array. The diode laser array structure is bonded, using a high thermal conductivity bond 22, to a solid-state laser crystal 24, which functions a laser gain medium. The crystal 24 may be, for example, Nd:YAG (neodymium:yttrium/aluminum/garnet) or Nd:YVO$_4$ (neodymium:yttrium vanadate). Light from the diode laser array element optically pumps a corresponding element of the solid-state laser, in which lasing also takes place if the crystal forms an appropriate resonant cavity. In the device of the invention, the resonant cavity of the solid-state laser also includes an electroabsorptive modulator 26. The electroabsorptive modulator 26 consists of a semiconductor quantum well stack, which is fabricated to have a band edge at a wavelength slightly shorter than the lasing wavelength. Therefore, when the modulator 26 is not electrically biased, it is effectively transparent to light emitted from the solid state laser. Q switching is achieved by reverse biasing the modulator 26, which shifts the band edge to a longer wavelength, resulting in strong absorption at the laser wavelength. The high absorption prevents laser oscillation and causes the gain to increase, as in other Q-switched lasers. The modulator bias is then removed abruptly, causing the band edge to shift back to its original wavelength, and resulting in a very short, high power laser pulse. For individual addressing of the modulator elements, bias may be conveniently applied through ring-shaped electrodes (not shown), where each electrode surrounds the light beam passing through the modulator.

Details of the electroabsorptive modulator design are not critical to the invention and may follow principles that are well known from the published literature. For example, the modulators 26 may be of the type described in *High-Speed InGaAlAs/InAlAs Multiple Quantum Well Optical Modulators with Bandwidths in Excess of 20 GHz at 1.55 μm*, by Isamu Kotaka et at., IEEE Photronics Technology Letters, Vol. 1, No. 5, May 1989, pp. 100–101.

The solid-state laser 24 may also include a frequency doubler 28 positioned immediately adjacent to the modulator 26. It is well known that harmonic generation crystals can provide doubling or quadrupling of optical frequencies. Such a doubler may be included in either an intracavity or an extracavity relationship to the solid-state laser 24. Parametric conversion to longer wavelengths can be achieved using an optical parametric oscillator (OPO) 30 placed at the output of the laser 24. The principles of OPOs is well understood and will not be described here. Like the doubler 28, it provides a convenient adjunct to the present invention but is not necessary to the invention in its broadest sense. The principles of design of frequency doublers and optical parametric oscillators are well described in a number of texts on solid-state lasers, such as *Solid State Laser Engineering* by W. Koechner, published by Springer Verlag, vol. 1, 3rd Edition (1992), and specifically chapter 10, pp. 508–57.

It will be appreciated from the foregoing that the present invention represents a significant advance in the field of microlaser arrays. In particular, the invention provides an extremely compact laser array. The cavity length of microlaser arrays is typically 1.0 mm or less, and the modulators 26 contribute only approximately 0.1 to this length. Individual addressing of the laser elements is rendered conveniently available using the techniques of the invention, as contrasted with other Q-switching approaches such as electro-optic or piezoelectric transducers. Moreover, the voltage required for Q switching using the present invention is only a few tens of volts, while piezoelectric Q switches need hundreds of volts. Finally, the Q-switching technique used in the present invention provides a switch response time that is 10 to 100 times faster than other methods, thereby producing shorter and more efficient laser output pulses.

It will also be appreciated that various modifications may be made without departing from the spirit and scope of the invention. Accordingly, the invention should not be limited except as by the following claims.

We claim:

1. An array of Q-switched microlasers, comprising:

an array of individually addressable diode lasers adapted to produce an array of generally parallel output light beams;

an array of microlenses positioned in the array of generally parallel output light beams to provide collimation of the output beams;

a crystal functioning as a laser gain medium, positioned to receive the generally parallel output light beams from the diode lasers, such that the light beams operate to provide optical pumping of the laser gain material of the crystal;

an array of individually addressable electroabsorptive modulators formed in resonant cavities that are defined in part by the laser gain medium; and means for selectively electrically biasing the electroabsorptive modulators periodically to provide a Q-switching function in which relatively higher power output peaks are obtained from selected elements of the microlaser laser array.

2. An array of Q-switched microlasers as defined in claim 1, wherein:

the array of individually addressable diode lasers is formed in a composite semiconductor layer that includes an active layer and a pair of integral reflective surfaces for each member of the array, to produce an emitted light beam for each member of the array generally perpendicular to the composite semiconductor layer.

3. An array of Q-switched microlasers as defined in claim 1, wherein:

the array of electroabsorptive modulators includes a single semiconductor quantum well stack and multiple biasing electrodes positioned at positions adjacent to respective light beams output from the laser gain medium, to provide individually addressable Q-switching of the light beams emitted from the microlaser array.

4. An array of Q-switched microlasers as defined in claim 3, wherein:

the crystal functioning as a gain medium and the array of electroabsorptive modulators incorporate reflective surfaces that define a laser cavity encompassing both the laser gain medium and the electroabsorptive modulators.

5. An array of Q-switched microlasers as defined in claim 1, and further comprising:

a frequency doubling crystal formed adjacent to the electroabsorptive modulators.

6. An array of Q-switched microlasers as defined in claim 1, and further comprising:

an optical parametric oscillator for conversion of light emitted from the array to longer wavelengths.

7. A method of generating an array of laser beams of relatively high power and beam quality, comprising the steps of:

generating an array of generally parallel light beams from an array of semiconductor diode lasers;

collimating each of the generally parallel light beams in the array;

optically pumping an array of solid-state lasers by introducing the array of generally parallel light beams into a laser crystal gain medium that in part defines a laser cavity for each of an array of solid state lasers;

emitting an array of amplified laser light beams from the gain medium; and selectively Q-switching the solid-state lasers to provide pulsed output beams of relatively high peak powers, wherein the Q-switching function is performed by controlling an electroabsorptive modulator element associated with each of the output beams.

8. A method as defined in claim 7, wherein:

the step of selectively Q-switching the solid-state lasers includes selectively biasing the electroabsorptive modulator elements to effect switching between a transparent state in which lasing is permitted to take place and an absorptive state in which lasing is suppressed.

9. A method as defined in claim 8, and further comprising:

doubling the output frequency of light beams emitted in the emitting step, using a frequency multiplier crystal.

10. A method as defined in claim 8, and further comprising:

converting the light beams emitted in the emitting step to longer wavelengths, using an optical parametric oscillator.

* * * * *